United States Patent
Byun

(10) Patent No.: US 12,087,108 B2
(45) Date of Patent: Sep. 10, 2024

(54) MEMORY APPARATUS FOR VEHICLE AND TEMPERATURE CONTROL METHOD OF THE MEMORY APPARATUS

(71) Applicant: Samsung Electronics Co., Ltd., Suwon-si (KR)

(72) Inventor: Jaebeom Byun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 450 days.

(21) Appl. No.: 17/481,595

(22) Filed: Sep. 22, 2021

(65) Prior Publication Data
US 2022/0262176 A1 Aug. 18, 2022

(30) Foreign Application Priority Data
Feb. 17, 2021 (KR) .................. 10-2021-0021138

(51) Int. Cl.
G07C 5/08 (2006.01)
H05K 7/20 (2006.01)

(52) U.S. Cl.
CPC .......... *G07C 5/085* (2013.01); *H05K 7/20209* (2013.01)

(58) Field of Classification Search
CPC .......... H05K 7/20272; H05K 7/20772; H05K 7/20781; H05K 7/20; H05K 7/202; H05K 7/20254; H05K 7/20763; G06F 1/20; G06F 1/3225; G06F 2200/201; G11B 2220/60; G11B 33/1413
See application file for complete search history.

(56) References Cited

U.S. PATENT DOCUMENTS

| | | | |
|---|---|---|---|
| 4,045,973 A | 9/1977 | Anderson et al. | |
| 5,740,018 A * | 4/1998 | Rumbut, Jr. | H05K 7/20636 361/720 |
| 6,735,973 B2 | 5/2004 | Lee | |
| 6,778,387 B2 | 8/2004 | Fairchild | |
| 7,965,508 B2 * | 6/2011 | Yamamoto | H01L 25/117 174/15.1 |
| 7,965,509 B2 * | 6/2011 | Campbell | H01L 23/473 361/720 |
| 8,027,162 B2 * | 9/2011 | Campbell | H05K 7/2079 361/716 |
| 8,181,470 B2 | 5/2012 | Narayanamurthy et al. | |
| 8,459,388 B2 | 6/2013 | Kim | |
| 8,570,744 B2 * | 10/2013 | Rau | H01L 23/473 361/720 |

(Continued)

FOREIGN PATENT DOCUMENTS

| | | | |
|---|---|---|---|
| KR | 1020200040946 A | | 4/2020 |
| WO | 2011004970 A3 | | 3/2011 |

(Continued)

*Primary Examiner* — Michael A Matey
(74) *Attorney, Agent, or Firm* — Muir Patent Law, PLLC

(57) ABSTRACT

A memory apparatus for a vehicle includes a storage apparatus including at least one memory device, a first fluid pipe having a first part that extends along a first outer surface of the storage apparatus, and a second fluid pipe having a second part that extends along a second outer surface of the storage apparatus, the second outer surface being opposite to the first outer surface. A first fluid having a high temperature flows through the first fluid pipe, and a second fluid having a low temperature flows through the second fluid pipe.

20 Claims, 12 Drawing Sheets

(56) References Cited

U.S. PATENT DOCUMENTS

| | | | | |
|---|---|---|---|---|
| 8,599,557 | B2* | 12/2013 | Peterson | G06F 1/20 |
| | | | | 361/698 |
| 8,659,897 | B2 | 2/2014 | Meijer et al. | |
| 9,298,231 | B2* | 3/2016 | Arvelo | F16L 41/10 |
| 9,723,762 | B1 | 8/2017 | Ross et al. | |
| 10,251,315 | B1 | 4/2019 | Mitchell et al. | |
| 10,548,239 | B1 | 1/2020 | Iyengar et al. | |
| 10,582,645 | B1* | 3/2020 | Kufahl | H05K 7/20772 |
| 10,602,640 | B1* | 3/2020 | Tsai | H05K 7/20254 |
| 10,705,578 | B2* | 7/2020 | Franz | H10B 12/01 |
| 10,939,583 | B2* | 3/2021 | Kanai | H05K 7/20263 |
| 10,954,846 | B2 | 3/2021 | Han et al. | |
| 2008/0062652 | A1 | 3/2008 | Lieberman | H01L 23/427 |
| | | | | 361/715 |
| 2008/0084668 | A1* | 4/2008 | Campbell | H05K 7/20509 |
| | | | | 257/E23.098 |
| 2009/0021908 | A1* | 1/2009 | Patel | G06F 1/20 |
| | | | | 361/688 |
| 2009/0034327 | A1* | 2/2009 | Yun | H05K 1/0209 |
| | | | | 361/689 |
| 2009/0277616 | A1* | 11/2009 | Cipolla | H01L 23/473 |
| | | | | 165/104.33 |
| 2010/0025010 | A1* | 2/2010 | Cipolla | H01L 23/4093 |
| | | | | 165/47 |
| 2010/0085712 | A1* | 4/2010 | Hrehor, Jr. | H05K 7/20254 |
| | | | | 361/699 |
| 2010/0091447 | A1* | 4/2010 | Jaggers | H05K 7/20254 |
| | | | | 361/679.47 |
| 2012/0174615 | A1 | 7/2012 | Cho | |
| 2013/0027870 | A1* | 1/2013 | Goldr an | H05K 7/2039 |
| | | | | 361/679.32 |
| 2013/0120926 | A1* | 5/2013 | Barina | H01L 23/4093 |
| | | | | 165/80.4 |
| 2013/0135812 | A1* | 5/2013 | Barina | H01L 23/4093 |
| | | | | 165/173 |
| 2013/0194745 | A1* | 8/2013 | Meijer | G06F 1/20 |
| | | | | 361/679.47 |
| 2014/0146461 | A1* | 5/2014 | Choi | G06F 1/203 |
| | | | | 361/752 |
| 2014/0153607 | A1* | 6/2014 | Chainer | G01K 7/02 |
| | | | | 374/1 |
| 2016/0100504 | A1* | 4/2016 | Iwasaki | H05K 7/20781 |
| | | | | 165/84 |
| 2016/0332508 | A1 | 11/2016 | Lee et al. | |
| 2018/0018001 | A1* | 1/2018 | Franz | G06F 1/20 |
| 2019/0150327 | A1 | 5/2019 | Inano et al. | |
| 2019/0208664 | A1 | 7/2019 | Saito | |
| 2020/0163253 | A1* | 5/2020 | Lunsman | G06F 1/20 |
| 2020/0344918 | A1* | 10/2020 | Wondimu | B21D 26/033 |
| 2023/0047496 | A1* | 2/2023 | Franz | H05K 7/20272 |

FOREIGN PATENT DOCUMENTS

| | | |
|---|---|---|
| WO | 2015111913 A1 | 7/2015 |
| WO | 2016021832 A1 | 2/2016 |

\* cited by examiner

MEMORY APPARATUS FOR VEHICLE AND TEMPERATURE CONTROL METHOD OF THE MEMORY APPARATUS

CROSS-REFERENCE TO RELATED APPLICATION

This application is based on and claims priority under 35 U.S.C. § 119 to Korean Patent Application No. 10-2021-0021138, filed on Feb. 17, 2021, in the Korean Intellectual Property Office, the disclosure of which is incorporated by reference herein in its entirety.

BACKGROUND

The inventive concept relates to a memory apparatus, and more particularly, to a memory apparatus for a vehicle, the memory apparatus being capable of performing temperature control, and a temperature control method of the memory apparatus.

Operating characteristics of a memory apparatus, such as a solid state drive (SSD) apparatus, may be limited by the temperature of the SSD. Generally, power used for an operation of a memory apparatus is lost as thermal energy, and when the thermal energy is not dissipated, the temperature of the memory apparatus may exceed the maximum operating temperature of the memory apparatus, which causes a failure of the memory apparatus. When the memory apparatus is exposed to the outside (i.e., is installed in a vehicle), the temperature of the memory apparatus falls below the minimum operating temperature of the memory apparatus, which may cause the memory apparatus to have a booting error. For example, in the case of a memory apparatus used in an autonomous driving vehicle, the memory apparatus may be directly exposed to a various temperature range experienced by the vehicle, and the memory apparatus may operate outside an operating temperature range in summer or winter, which causes the memory apparatus in the vehicle to have a failure in operation.

SUMMARY

The inventive concept provides a memory apparatus for a vehicle, the memory apparatus being capable of controlling its temperature within an operating temperature range, and a temperature control method of the memory apparatus.

According to an aspect of the inventive concept, there is provided a memory apparatus for a vehicle, the memory apparatus including: a storage apparatus including at least one memory device; a first fluid pipe having a first part that extends along a first outer surface of the storage apparatus; and a second fluid pipe having a second part that extends along a second outer surface of the storage apparatus, the second surface being opposite to the first surface. A first fluid having a high temperature greater than or equal to a reference temperature flows through the first fluid pipe, and a second fluid having a low temperature less than the reference temperature flows through the second fluid pipe.

According to an aspect of the inventive concept, there is provided a memory apparatus for a vehicle, the memory apparatus including: a storage apparatus including at least one memory device and a temperature sensor; a first fluid pipe having a first part that extends along a first outer surface of the storage apparatus, wherein a flow of a first fluid having a high temperature greater than or equal to a reference temperature is controlled by a first valve at the first fluid pipe; and a second fluid pipe having a second part that extends along a second outer surface of the storage apparatus, the second outer surface being opposite to the first outer surface, wherein a flow of a second fluid having a low temperature less than the reference temperature is controlled by a second valve in the second fluid pipe. Opening and closing of each of the first valve and the second valve are controlled according to a temperature of the storage apparatus measured by the temperature sensor to adjust the temperature of the storage apparatus.

According to an aspect of the inventive concept, there is provided a memory apparatus for a vehicle, the memory apparatus including: a storage apparatus including a package substrate, a plurality of flash memory devices, a dynamic random access memory (DRAM) device, a controller, and a temperature sensor; a case having a rectangular parallelepiped shape and accommodating the storage apparatus; a first fluid pipe having a first part that extends along a first outer surface of the case, wherein a flow of a first fluid having a high temperature greater than or equal to a reference temperature is controlled by a first valve at the first fluid pipe; and a second fluid pipe having a second part that extends along a second outer surface of the case, the second outer surface being opposite to the first outer surface, wherein a flow of a second fluid having a low temperature less than the reference temperature is controlled by a second valve at the second fluid pipe. Opening and closing of each of the first valve and the second valve are controlled according to a temperature of the storage apparatus measured by the temperature sensor to adjust the temperature of the storage apparatus.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
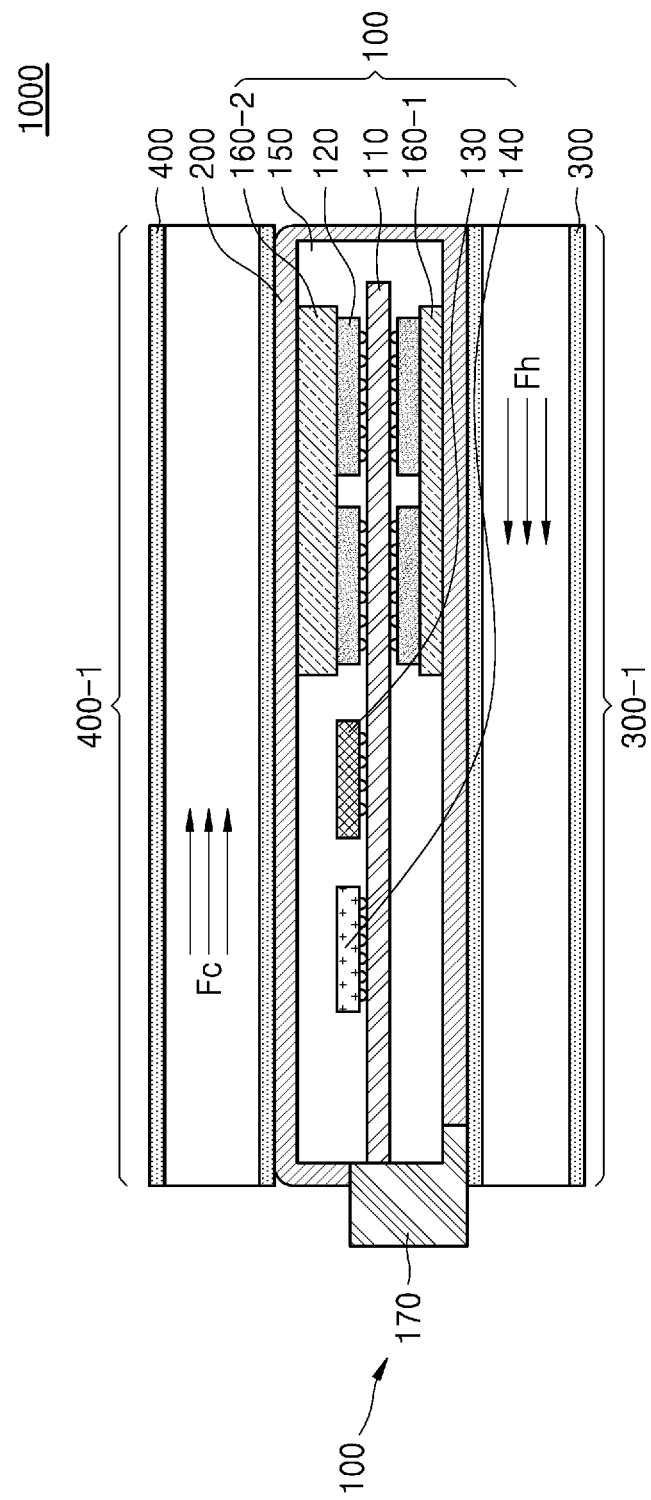
FIG. 1 is a cross-sectional view of a memory apparatus for a vehicle, according to an embodiment of the inventive concept.

Hereinafter, embodiments of the inventive concept will be described in detail with reference to the accompanying drawings. Like reference numerals in the drawings denote like elements, and thus their description will be omitted.

Figure 2:
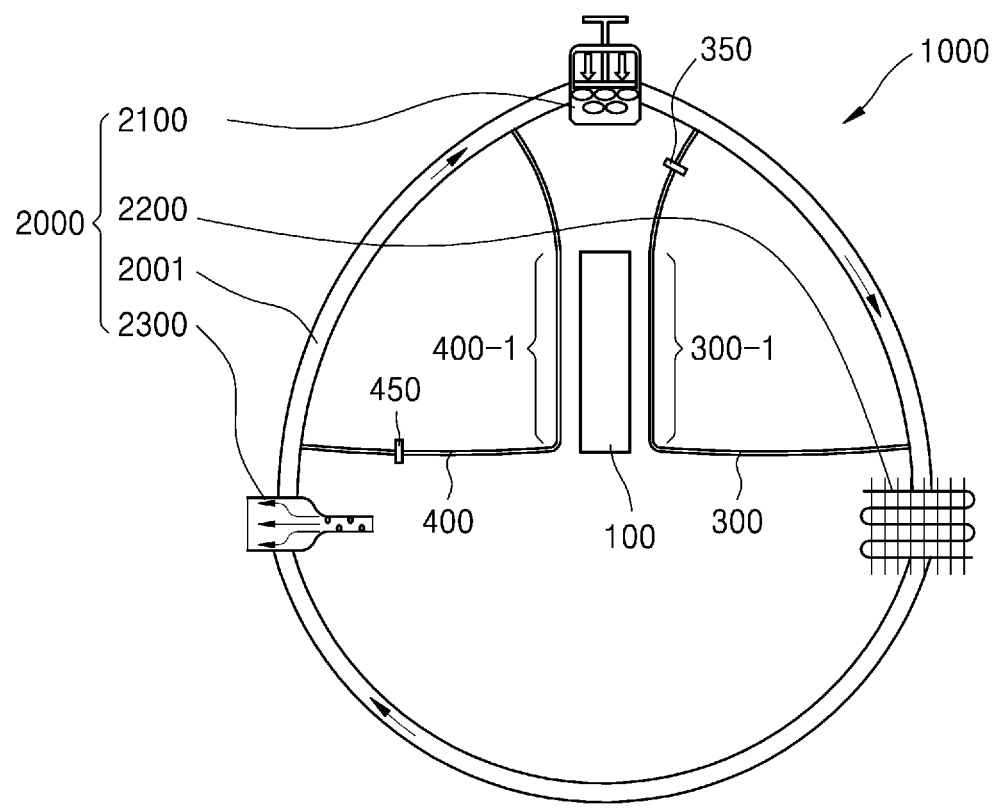
FIG. 2 is a conceptual diagram illustrating an operating principle of the memory apparatus for a vehicle of FIG. 1.

FIG. 1 is a cross-sectional view of a memory apparatus 1000 for a vehicle, according to an embodiment of the inventive concept, and FIG. 2 is a conceptual diagram illustrating an operating principle of the memory apparatus 1000 for a vehicle of FIG. 1. In some embodiments, the vehicle may include an autonomous vehicle.

Referring to FIGS. 1 and 2, the memory apparatus 1000 for a vehicle (hereinafter, simply referred to as "memory apparatus" or "vehicle memory apparatus") according to the present embodiment may include a storage apparatus 100, a case 200, a first fluid pipe 300, and a second fluid pipe 400. The storage apparatus 100 has a semiconductor package structure, and may include a package substrate 110, a first memory device 120, a second memory device 130, a controller 140, a sealing material 150, and thermal interface materials (TIMs) 160-1 and 160-2.

The package substrate 110 may include or may be formed of various types of substrates, such as a printed circuit board (PCB), a flexible PCB, and a tape substrate. The package substrate 110 may include or may be formed of, for example, a body layer having an upper surface and a lower surface, and resin layers respectively formed on the upper surface and the lower surface of the body layer. The resin layers may include multi-layered structures, and a signal layer, a ground layer, a power layer, or the like may be interposed between the multi-layered structures. A separate wiring pattern may also be formed on the resin layers. Although not illustrated in FIG. 1, a plurality of passive devices, such as a capacitor, an inductor, and a resistor, may be mounted on the package substrate 110. A connector 170 for communicating with an external apparatus may be arranged on one side of the package substrate 110, for example, the left side thereof, by penetrating the case 200, thereby being connected to the package substrate 110.

The first memory device 120 may be a non-volatile memory device. For example, the first memory device 120 may be a flash memory device. The type of the first memory device 120 is not limited to the flash memory device. The first memory device 120 may have a package structure in which a plurality of semiconductor chips are mounted on a PCB. However, according to embodiments, the first memory device 120 may have an individual semiconductor chip structure. The storage apparatus 100 may include a plurality of first memory devices 120. The first memory device 120 may be mounted on upper and lower surfaces of the package substrate 110. As shown in FIG. 1, in the storage apparatus 100 of the memory apparatus 1000 of the present embodiment, four first memory devices 120 may be mounted on the package substrate 110. For example, two first memory devices 120 may be mounted on each of the upper and lower surfaces of the package substrate 110. However, the number of first memory devices 120 mounted on the package substrate 110 is not limited to four. For example, one first memory device 120 may be mounted on each of the upper and lower surfaces of the package substrate 110, or three or more first memory devices 120 may be mounted on each of the upper and lower surfaces of the package substrate 110.

The first memory device 120 may be mounted on the package substrate 110 in a ball grid array (BGA) method through an external connection terminal such as a bump and a solder ball. However, the mounting method of the first memory device 120 is not limited to the BGA method. For example, the first memory device 120 may be mounted on the package substrate 110 in a pin grid array (PGA) method, a tape carrier package (TCP) method, a chip-on-board (COB) method, a quad flat non-leaded (QFN) method, a quad flat package (QFP) method, or the like.

The second memory device 130 may be a volatile memory device. For example, the second memory device 130 may be a dynamic random access memory (DRAM) device. The type of the second memory device 130 is not limited to the DRAM device. The second memory device 130 is an auxiliary memory device, and may function as a buffer in data exchange between the controller 140 and the first memory device 120. The second memory device 130 may be mounted on the package substrate 110 in various methods such as the BGA method, the PGA method, the TCP method, the COB method, and the QFN method, the QFP method.

The controller 140 may control input/output of signals to semiconductor chips in the first memory device 120. The controller 140 may include a program capable of exchanging signals with an external apparatus in a method according to a serial advanced technology attachment (SATA) standard, a parallel advanced technology attachment (PATA) standard, or a small computer system interface (SCSI) standard. Herein, the SATA standard may not only include so-called SATA-1, but also cover all SATA series standards, such as SATA-2, SATA-3, and external SATA (e-SATA). The PATA standard may cover all integrated drive electronics (IDE) series standards, such as IDE and enhanced-IDE (E-IDE). The controller 140 may perform Error Correction Code (EEC) or Flash Translate Layer (FTL) processing, or the like. The controller 140 may be mounted on the package substrate 110 in a package form. The controller 140 may also be mounted on the package substrate 110 in various methods such as the BGA method, the PGA method, the TCP method, the COB method, the QFN method, and the QFP method.

In the memory apparatus 1000 according to the present embodiment, the storage apparatus 100 may include, for example, an SSD package. Accordingly, the controller 140 may correspond to an SSD controller. In the memory apparatus 1000 of the present embodiment, the storage apparatus 100 is not limited to the SSD package. For example, the storage apparatus 100 may be a storage apparatus different from the SSD package, including various types of memory devices.

The sealing material 150 may cover and seal the first memory device 120, the second memory device 130, and the controller 140, which are on the package substrate 110. The sealing material 150 may seal the first memory device 120, the second memory device 130, and the controller 140 to protect the same from external physical and/or chemical impacts. For example, the sealing material 150 may include or may be formed of an epoxy molding compound (EMC). A material of the sealing material 150 is not limited thereto. In the memory apparatus 1000 of the present embodiment, the storage apparatus 100 may include the TIMs 160-1 and 160-2, and accordingly, the sealing material 150 may cover some of side surfaces and lower surfaces of the TIMs 160-1 and 160-2.

The TIMs 160-1 and 160-2 may include a first TIM 160-1 arranged between the first memory device 120 arranged on the lower surface of the package substrate 110 and the case 200, and a second TIM 160-2 arranged between the first memory device 120 arranged on the upper surface of the package substrate 110 and the case 200. The TIMs 160-1 and 160-2 may discharge heat generated by the first memory device 120 to the outside, or may absorb heat from the outside. For example, when cooling the storage apparatus 100, heat generated by the first memory device 120 may be discharged to the outside through the TIMs 160-1 and 160-2, and when heating the storage apparatus 100, heat may be absorbed from the outside through the TIMs 160-1 and 160-2. Accordingly, materials having high thermal conductivity (i.e., materials having low thermal resistance) such as grease, a tape, an elastomer filling pad, and a phase change material may be used in the TIMs 160-1 and 160-2. However, the materials of the TIMs 160-1 and 160-2 are not limited to the above materials. In FIG. 1, the first TIM 160-1 is thinner than the second TIM 160-2. The present invention is not limited thereto. In some embodiments, the first TIM 160-1 may be thicker than the second TIM 160-2. In some embodiments, the first TIM 160-1 and the second TIM 160-2 may have substantially the same thickness. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The case 200 may have a structure accommodating the storage apparatus 100. For example, when the storage apparatus 100 has a rectangular parallelepiped shape, the case 200 may have an empty box form having a rectangular parallelepiped shape which surrounds the storage apparatus 100. When the storage apparatus 100 has a shape other than the rectangular parallelepiped shape, the case 200 may have another form which can accommodate (i.e., surround) the shape of the storage apparatus 100. The case 200 may include or may be formed of a material facilitating heat transfer between the storage apparatus 100 and each of the first fluid pipe 300 and the second fluid pipe 400 while maintaining a fixed shape to protect the storage apparatus 100. For example, the case 200 may include or may be formed of a material having good thermal conductivity, such as metal.

The first fluid pipe 300 may have a first part 300-1 that passes adjacent to (i.e., extends along) a lower surface of the case 200. The second fluid pipe 400 may have a second part 400-1 that passes adjacent to (i.e., extends along) an upper surface of the case 200. Herein, the first part 300-1 may mean a portion of the first fluid pipe 300, the portion being adjacent to the lower surface of the case 200, and the second part 400-1 may mean a portion of the second fluid pipe 400, the portion being adjacent to the upper surface of the case 200. The first part 300-1 and the second part 400-1 may have different shapes from other portions in functions. The shapes of the first part 300-1 and the second part 400-1 will be described in more detail in the description with reference to FIGS. 3A to 4C.

A fluid having a high temperature may flow through the first fluid pipe 300, and a fluid having a low temperature may flow through the second fluid pipe 400. Herein, high temperature and low temperature are relative concepts and may be variously defined. According to embodiments, high temperature and low temperature may be defined by respective set temperatures. For example, a temperature of greater than or equal to 50° C. may be defined as high temperature, and a temperature of less than or equal to 10° C. may be defined as low temperature. In some embodiments, high temperature and low temperature may be defined based on one reference temperature, for example, 30° C.

Each of the first fluid pipe 300 and the second fluid pipe 400 may be a sub-pipe branched from a main fluid pipe 2001 of an air conditioning apparatus 2000 of a vehicle. As shown in FIG. 2, the air conditioning apparatus 2000 may include the main fluid pipe 2001, a compressor 2100, a condenser 2200, and an evaporator 2300. In some embodiments, the air conditioning apparatus 2000 may be installed in a vehicle with the memory apparatus 1000.

The air conditioning apparatus 2000 is a cooling/heating apparatus cooling the interior of a vehicle by an application of inhaling hot air in the interior, exchanging heat with a low-temperature refrigerant, and then discharging cooled air to the interior and heating the interior in an opposite manner of the cooling the interior, and may include the compressor 2100, the condenser 2200, and the evaporator 2300. For example, the air conditioning apparatus 2000 is a device performing heating and cooling by forming a cycle in which a fluid called as refrigerant is circulated through the compressor 2100, the condenser 2200, and the evaporator 2300, which are connected through the main fluid pipe 2001. The compressor 2100 may be an apparatus for compressing a fluid, such as a gas, at high temperature/high pressure. A high-temperature/high-pressure gas from the compressor 2100 enters the condenser 2200 through the main fluid pipe 2001 and condenses while releasing heat in the condenser 2200 to be converted into a low-temperature/high-pressure liquid. Accordingly, the interior in which the condenser 2200 is arranged may be heated. Subsequently, the low-temperature/high-pressure liquid enters the evaporator 2300 and expands in the evaporator 2300 to be converted into a low-temperature/low-pressure gas. The evaporator 2300 may exchange heat with the surrounding space or an object to be cooled. For example, the evaporator 2300 may absorb heat by liquid evaporation, thereby cooling the interior.

In the memory apparatus 1000 of the present embodiment, the first fluid pipe 300 may branch from the main fluid pipe 2001 on an output end side of the compressor 2100 and be coupled to the main fluid pipe 2001 on an input end side of the condenser 2200 via the storage apparatus 100. As described above, the first part 300-1 of the first fluid pipe 300 may be arranged adjacent to the lower surface of the storage apparatus 100. A fluid Fh from the compressor 2100 is a high-temperature/high-pressure gas, and accordingly, when the fluid Fh flows through the first fluid pipe 300, the storage apparatus 100 may be heated through the first part 300-1. A first valve 350 may be arranged at the first fluid pipe 300, and the flow of the fluid Fh to the first fluid pipe 300 may be turned on/off by the turned-on/off of the first valve 350. Herein, the turned-on of the first valve 350 may mean opening of the first valve 350, and the turned-off of the first valve 350 may mean closing of the first valve 350. For example, the storage apparatus 100 may selectively heated by turning on/off the flow of the fluid Fh to the first fluid pipe 300 by the turned-on/off of the first valve 350. For example, when the temperature of the storage apparatus 100 falls to a temperature less than or equal to a set reference temperature, the first valve 350 may be turned on, and the fluid Fh having a high temperature may flow through the first fluid pipe 300, thereby heating the storage apparatus 100 by the fluid Fh.

In the memory apparatus 1000 of the present embodiment, the second fluid pipe 400 may branch from the main fluid pipe 2001 on an output end side of the evaporator 2300 and be coupled to the main fluid pipe 2001 on an input end side of the compressor 2100 via the storage apparatus 100.

As described above, the second part 400-1 of the second fluid pipe 400 may be arranged adjacent to the upper surface of the storage apparatus 100. A fluid Fc from the evaporator 2300 is a low-temperature/low-pressure gas, and accordingly, when the fluid Fc flows through the second fluid pipe 400, the storage apparatus 100 may be cooled through the second part 400-1. A second valve 450 may be arranged at the second fluid pipe 400, and the flow of the fluid Fc to the second fluid pipe 400 may be turned on/off by the turned-on/off of the second valve 450. For example, the storage apparatus 100 may be selectively cooled by turning on/off the flow of the fluid Fc to the second fluid pipe 400 by the turned-on/off of the second valve 450. For example, when the temperature of the storage apparatus 100 rises to a temperature greater than or equal to the set reference temperature, the second valve 450 may be turned on, and the fluid Fc having a low temperature may flow through the second fluid pipe 400, thereby cooling the storage apparatus 100 by the fluid Fc.

On/off operations of the first and second valves 350 and 450 may be performed through control by a controller or a control module arranged inside or outside the storage apparatus 100. For example, the controller or the control module may transmit a wired or wireless signal to a device that physically operates on/off of the first and second valves 350 and 450 to control the on/off operations of the first and second valves 350 and 450. For example, a value may include a diaphragm structure, a gate structure, a glove structure, or the like according to a mechanical structure form. To control a valve having the mechanical structure, when a coil is wound in a circular shape and an electric current is passed in the valve, a magnetic field is generated in the circle, and a magnetic material is brought to the magnetic field and moved to a center portion of the circle. Accordingly, by forming the first and second valves 350 and 450 in a solenoid valve structure in which a coil converting electrical energy into mechanical energy and an iron rod, which is a magnetic material, are combined, on/off of the first and second valves 350 and 450 may be electrically controlled. In some embodiments, the first and second valves 350 and 450 may be electrically connected via wireless or wired communication to control on/off thereof. The temperature adjustment of the storage apparatus 100 through the on/off of the first and second valves 350 and 450 will be described in more detail in the description of FIG. 8A.

The memory apparatus 1000 of the present embodiment may include the storage apparatus 100, the first fluid pipe 300, and the second fluid pipe 400. The first part 300-1 of the first fluid pipe 300 may adjacently passes on the lower surface of the storage apparatus 100, and the second part 400-1 of the second fluid pipe 400 may adjacently passes on the upper surface of the storage apparatus 100. With this structure, the memory apparatus 1000 of the present embodiment heats the storage apparatus 100 with a high-temperature fluid through the first part 300-1 of the first fluid pipe 300 when the temperature of the storage apparatus 100 is low, and cools the storage apparatus 100 with a low-temperature fluid through the second part 400-1 of the second fluid pipe 400 when the temperature of the storage apparatus 100 is high. Accordingly, the memory apparatus 1000 of the present embodiment may stably maintain the temperature of the storage apparatus 100 within an operating temperature range regardless of an external temperature. The memory apparatus 1000 is a memory apparatus for a vehicle, which is arranged in a vehicle, and may stably maintain the temperature of the storage apparatus 100 within the operating temperature range regardless of an external temperature of the vehicle, such as a temperature in winter or summer, based on the above-described structure. As a result, the memory apparatus 1000 of the present embodiment enables an implementation of a reliable memory apparatus for a vehicle regardless of the external temperature thereof.

Figure 3A:
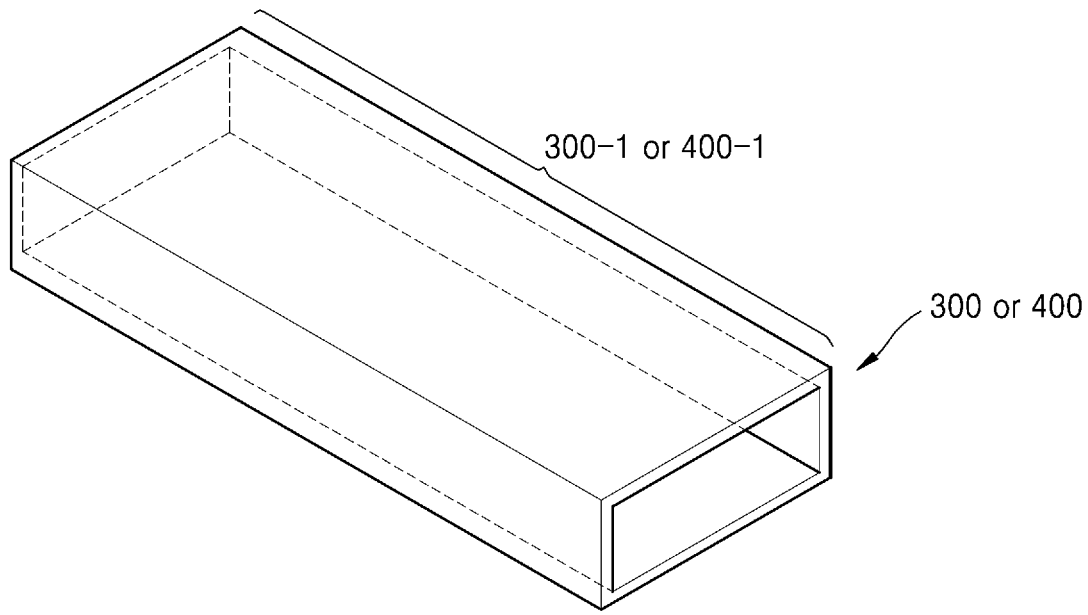
FIGS. 3A and 3B are perspective views each illustrating a shape of a fluid pipe included in the memory apparatus for a vehicle of FIG. 1.
Figure 3B:
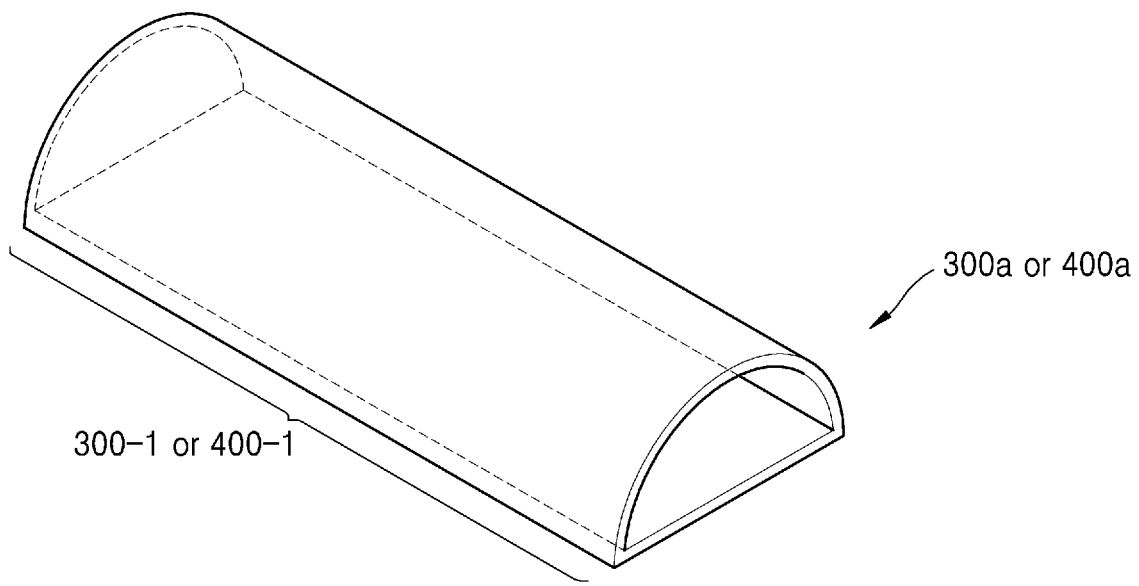

FIGS. 3A and 3B are perspective views each illustrating a shape of a fluid pipe included in the memory apparatus 1000 of FIG. 1. Descriptions will be made with reference to FIGS. 1 and 2 together, and those described with reference to FIGS. 1 and 2 will be briefly described or omitted.

Referring to FIG. 3A, in the memory apparatus 1000 of the present embodiment, the first part 300-1 of the first fluid pipe 300 and the second part 400-1 of the second fluid pipe 400 may have a rectangular parallelepiped pipe shape. Based on this structure, the first part 300-1 and the second part 400-1 may be arranged to respectively have a contact area as large as possible with the lower and upper surfaces of the storage apparatus 100 and/or the lower and upper surfaces of the case 200 through a wide flat portion of each of the first part 300-1 and the second part 400-1. A surface of the first part 300-1 and the second part 400-1, which is in contact with the storage apparatus 100 and/or the case 200, may include or may be formed of a material having high thermal conductivity, such as metal, and other surfaces thereof may include or may be formed of a material having low thermal conductivity. However, according to embodiments, the first part 300-1 and the second part 400-1 may include or may be formed of a material having high thermal conductivity. As a result, more rapid heat transfer may be possible between the storage apparatus 100 and the first part 300-1 and between the storage apparatus 100 and the second part 400-1, and the efficiency of heating and cooling of the storage apparatus 100 may be maximized. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to, or "directly disposed on" another element, or as "contacting" or "in contact with" another element, there are no intervening elements present at the point of contact.

Other portions of the first fluid pipe 300 excluding the first part 300-1 and other portions of the second fluid pipe 400 excluding the second part 400-1 may also have the rectangular parallelepiped pipe shape. The present invention is not limited thereto. In some embodiment, the other portions of the first and second fluid pipes 300 and 400 may have a different shape from the rectangular parallelepiped pipe shape. For example, the other portions of the first and second fluid pipes 300 and 400 may have a circular pipe shape. The other portions of the first fluid pipe 300 and the other portions of the second fluid pipe 400 do not affect heat transfer to the storage apparatus 100, and thus may have a structure in which fluid flows smoothly, for example, a circular pipe shape. The other portions of the first fluid pipe 300 and the other portions of the second fluid pipe 400 may have a material having low thermal conductivity. Accordingly, heat loss may be minimized in portions other than the first part 300-1 and the second part 400-1.

Referring to FIG. 3B, in the memory apparatus 1000 of the present embodiment, a first part 300-1 of the first fluid pipe 300a and a second part 400-1 of the second fluid pipe 400a may have a semicircle pipe shape with a flat bottom surface. Based on this structure, the first part 300-1 and the second part 400-1 may be arranged to have a contact area as large as possible with the lower and upper surfaces of the storage apparatus 100 and/or the lower and upper surfaces of the case 200 through the flat bottom surface.

Although the first part 300-1 of the first fluid pipes 300 and 300a, and the second part 400-1 of the second fluid pipe 400 and 400 are described in the rectangular parallelepiped shape and the semicircle pipe shape, the shapes of the first part 300-1 of the first fluid pipes 300 and 300a, and the second part 400-1 of the second fluid pipes 400 and 400a are not limited thereto. For example, the first part 300-1 of the first fluid pipe and the second part 400-1 of the second fluid pipe may have various pipe shapes having at least one surface which may be arranged to have a contact area as large as possible with the lower and upper surfaces of the storage apparatus 100 and/or the case 200.

Figure 4A:
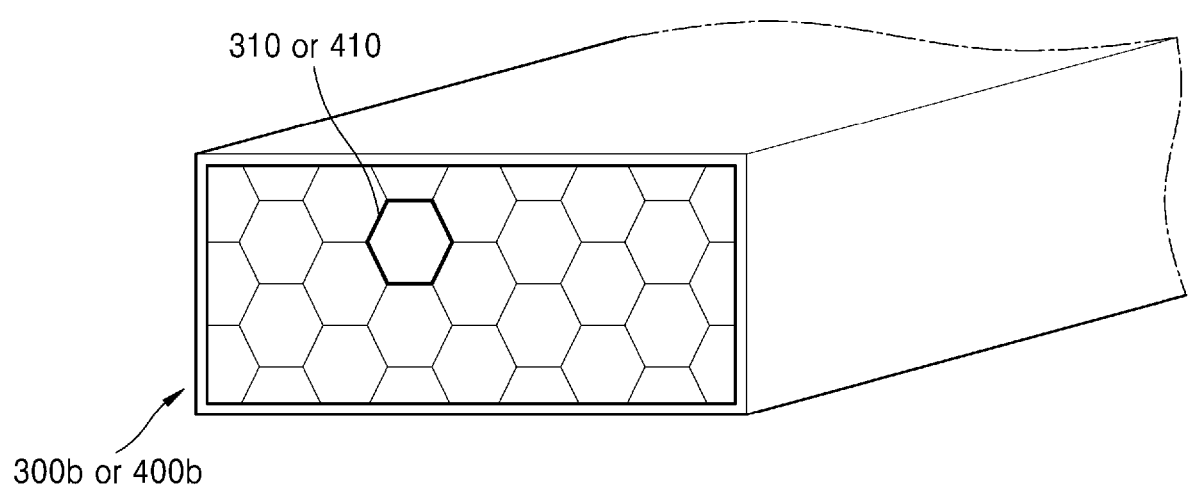
FIG. 4A illustrates a shape of a fluid pipe included in the memory apparatus for a vehicle of FIG. 1, and FIGS. 4B and 4C are graphs each illustrating a flow rate and temperature distribution according to a height in the fluid tube.
Figure 4B:
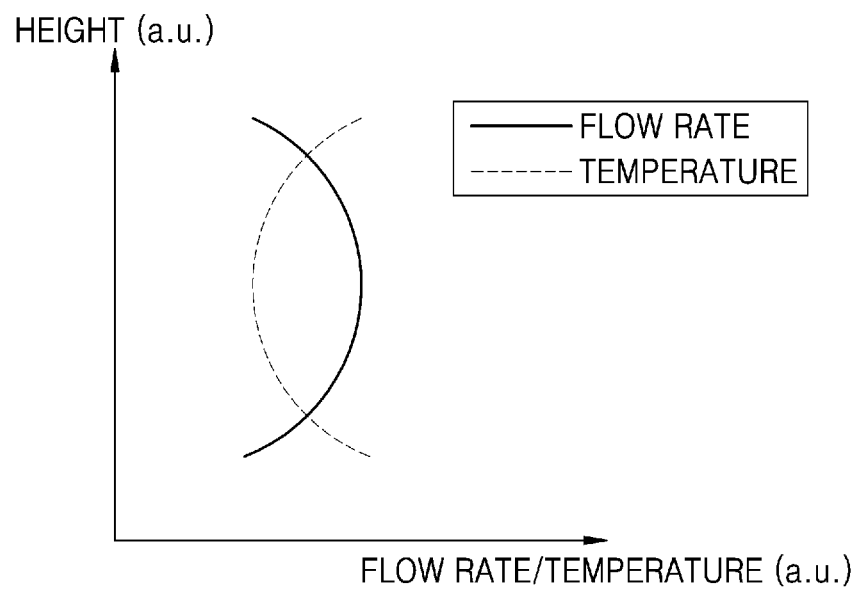
Figure 4C:
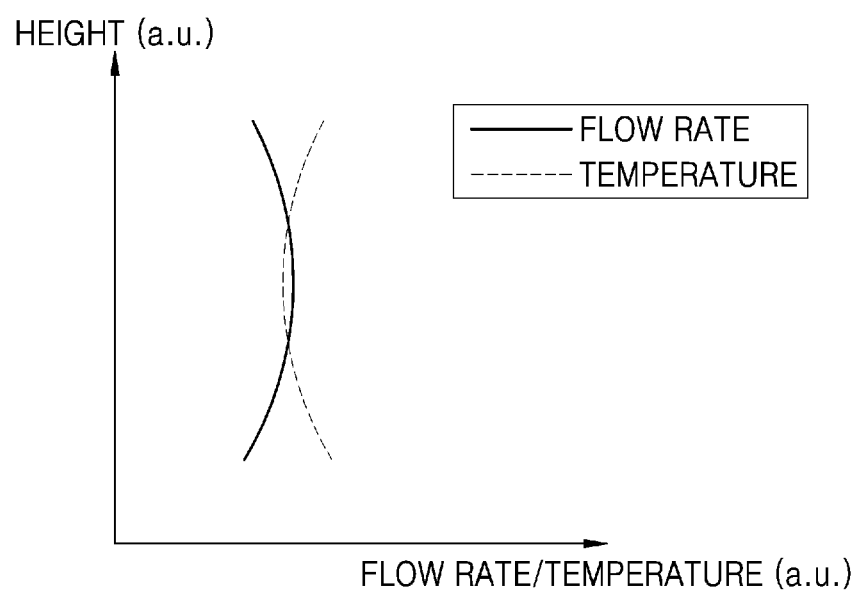

FIG. 4A illustrates a shape of a fluid pipe included in the memory apparatus 1000 for a vehicle of FIG. 1, FIG. 4B is a graph illustrating a flow rate and temperature distribution according to a height in the fluid tube which has a general hollow pipe shape, and FIG. 4C is a graph illustrating a flow rate and temperature distribution according to a height in the fluid tube which has a hexagonal porous pipe shape of FIG. 4A in a cross-sectional view taken in a direction perpendicular to a lengthwise direction of the fluid tube. For example, a flow may flow along the lengthwise direction of the fluid tube via a plurality of flow passages each of which has a hexagonal shape. In some embodiment, the plurality of flow passages may extend parallel to each other along the lengthwise direction of the fluid tube. In FIGS. 4B and 4C, the x-axis represents the flow rate and temperature. A unit of the x-axis is an arbitrary unit, and the y-axis represents the height in the fluid pipe. The unit is an arbitrary unit. In some embodiments, the temperature of the x-axis, and the flow rate of the x-axis may be normalized to show differences in trends of height v. flow rate, and differences in trends of height v. temperature between FIGS. 4B and 4C.

Referring to FIGS. 4A to 4C, in the memory apparatus 1000 of the present embodiment, a first part 300-1 of the first fluid pipe 300b and a second part 400-1 of a second fluid pipe 400b may have shapes of hexagonal porous pipes 310 and 420. As the first part 300-1 and the second part 400-1 have the shapes of the hexagonal porous pipes 310 and 420, the flow rate in the pipe may be kept constant, and the temperature distribution in the flow rate may also be uniform. Accordingly, the first part 300-1 and the second part 400-1 having the shapes of the hexagonal porous pipes 310 and 420 may enable rapid and efficient heat transfer between the storage apparatus 100 and each of the first part 300-1 and the second part 400-1.

As shown in FIG. 4B, when the first part 300-1 and the second part 400-1 has a general hollow pipe shape instead of the hexagonal porous pipe shape, in a direction of the height in the pipe, the flow rate may be the fastest in a central portion of the pipe, and also the temperature may be the lowest in the central portion of the pipe. As described above, when there is a flow rate difference and temperature distribution according to the height in the pipe, heat transfer may be non-uniform and the efficiency of heat transfer may be decreased. For example, when considering cooling of the storage apparatus 100, a high temperature of a lower portion of the pipe may lower cooling efficiency.

As shown in FIG. 4C, when the first part 300-1 and the second part 400-1 have the shapes of hexagonal porous pipes, in the direction of height in the pipe, the flow rate may be constant in a certain level (i.e., the distribution of the flow rate may be within a predetermined range which is smaller than that of FIG. 4B), and also the temperature may be constant in a certain level (i.e., the distribution of the temperature may be within a predetermined range which is smaller than that of FIG. 4B), regardless of the height in the pipe. As a result, as the first part 300-1 and the second part 400-1 have the shapes of hexagonal porous pipes, the flow rate and temperature in the pipe may be constantly maintained, and thus, heat transfer to the storage apparatus 100 may be performed quickly and efficiently.

Figure 5A:
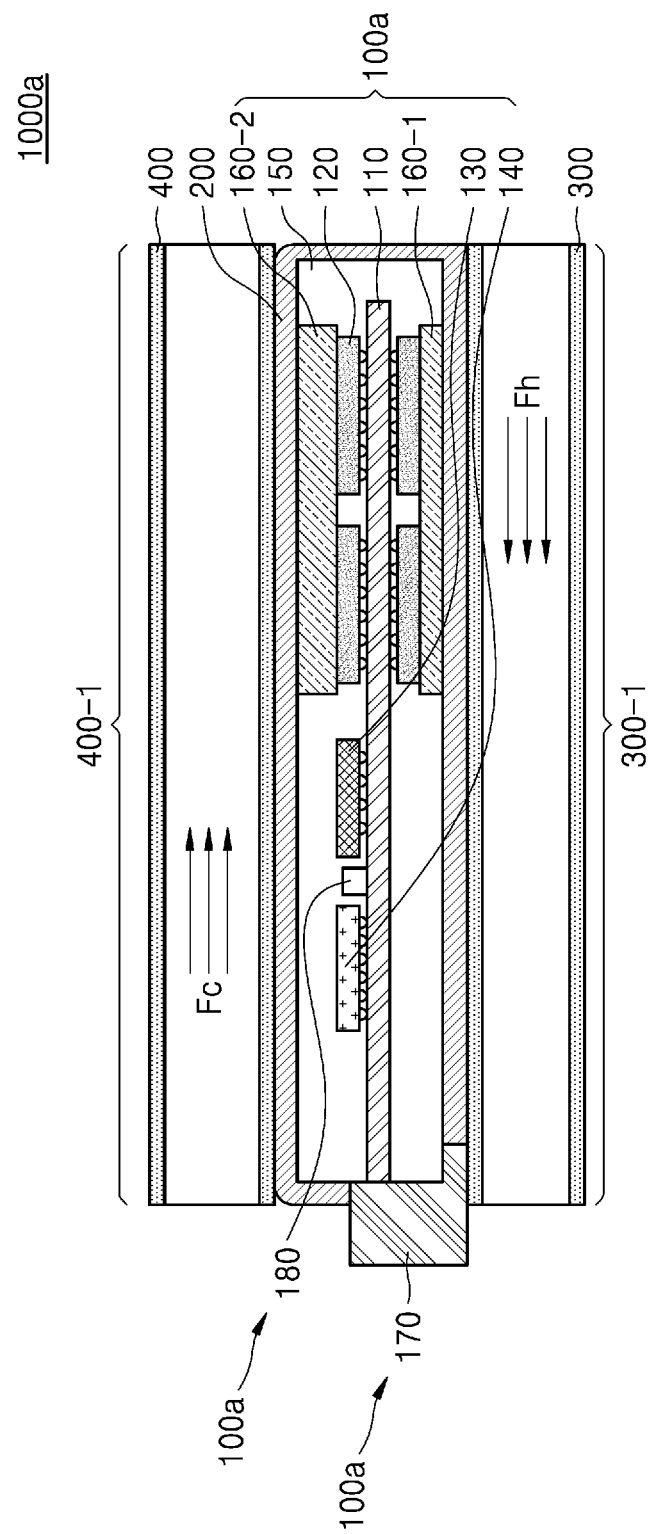
FIGS. 5A to 5C are cross-sectional views each illustrating a memory apparatus for a vehicle, according to embodiments of the inventive concept.
Figure 5B:
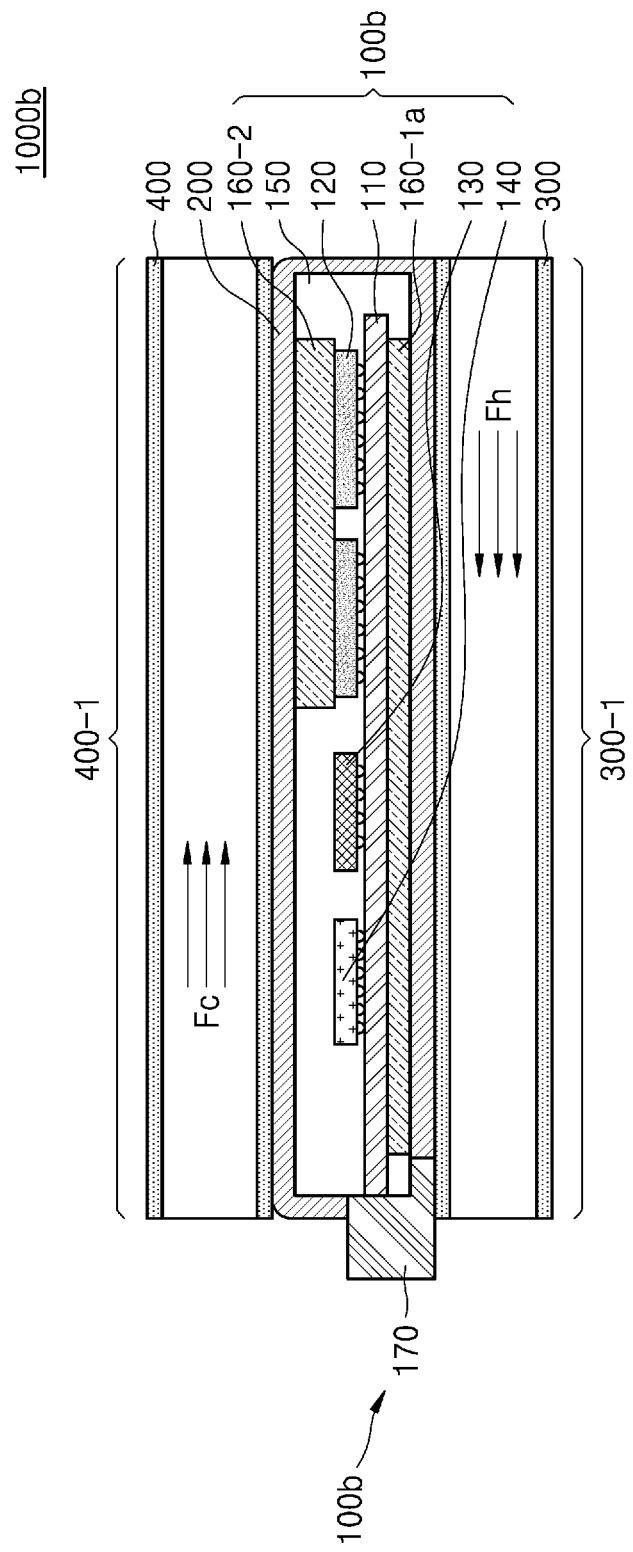
Figure 5C:
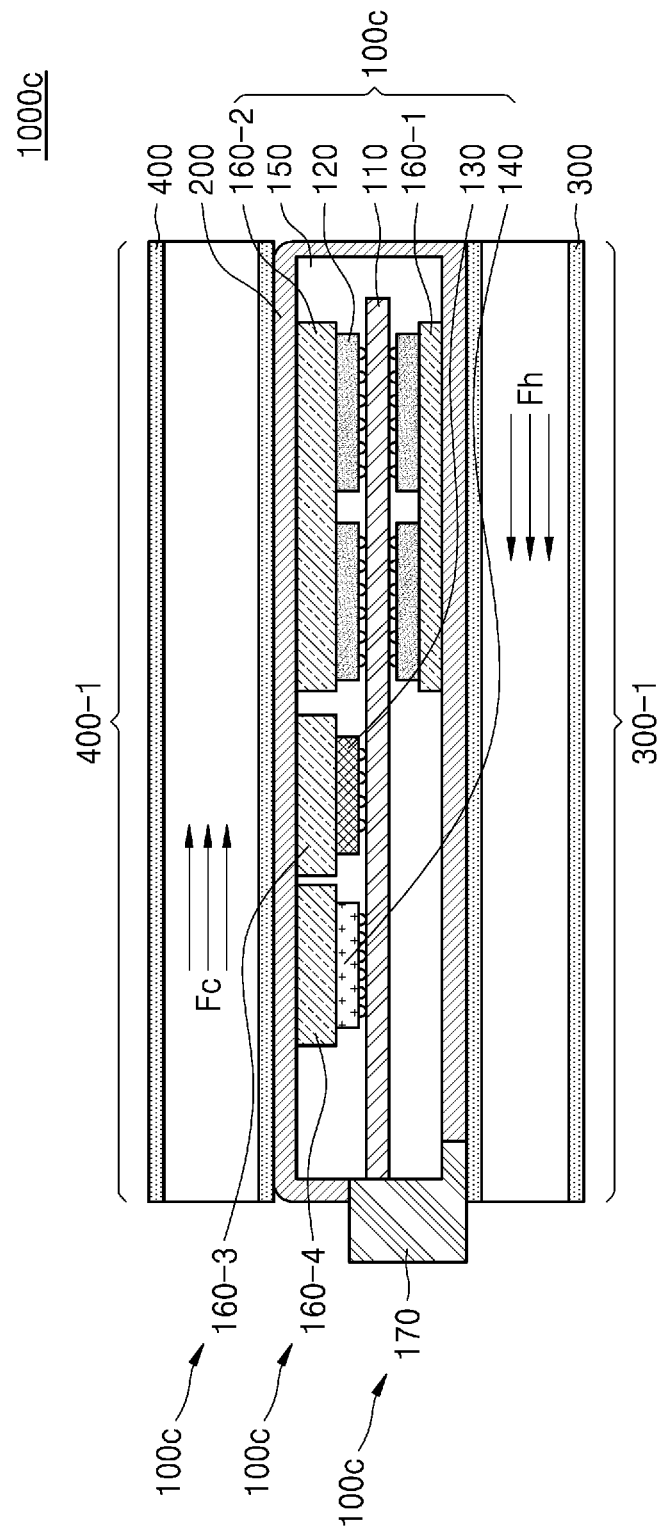

FIGS. 5A to 5C are cross-sectional views each illustrating a memory apparatus, according to embodiments of the inventive concept. Descriptions made with reference to FIGS. 1 to 4C will be briefly described or omitted.

Referring to FIG. 5A, a memory apparatus 1000a of the present embodiment may be different from the memory apparatus 1000 of FIG. 1 in the structure of a storage apparatus 100a. For example, in the memory apparatus 1000a of the present embodiment, the storage apparatus 100a may further include a temperature sensor 180 on the package substrate 110. The temperature sensor 180 may be, for example, a temperature sensor based on a diode. An I-V graph of the diode may vary depending on the temperature. According to a temperature, a current or a slope at a particular voltage of the I-V graph of the diode may vary. By quantifying the current or the slope at a particular voltage of the I-V graph of the diode, temperature may be measured through the diode. However, in the memory apparatus 1000a of the present embodiment, the temperature sensor 180 is not limited to a temperature sensor based on a diode. For example, in the memory apparatus 1000a of the present embodiment, various temperature sensors may be used in the temperature sensor 180 such as a thermocouple, a resistance temperature detector (RTD) sensor, a thermistor, and an infrared temperature sensor.

The temperature sensor 180 may be arranged adjacent to a device that has a high possibility of increasing the temperature in the storage apparatus 100a or generates a lot of heat. For example, as shown in FIG. 5A, the temperature sensor 180 may be arranged adjacent to the controller 140. However, the arrangement position of the temperature sensor 180 is not limited thereto. For example, the temperature sensor 180 may be arranged adjacent to the first memory device 120. According to embodiments, the storage apparatus 100 may include a plurality of temperature sensors 180, and the plurality of temperature sensors 180 may be arranged at various positions in the storage apparatus 100. In some embodiments, the temperature sensor 180 may be arranged in a chip or a package configuring at least one of the first memory device 120, the second memory device 130, and the controller 140. When the temperature sensor 180 is arranged in (i.e., integrated within) a chip, the temperature sensor 180 may be a temperature sensor based on a diode when considering a manufacturing process and size.

In the memory apparatus 1000a of the present embodiment, the temperature of the storage apparatus 100a may be measured through the temperature sensor 180, and based on the measured temperature, the turned-on/off of the first valve 350 of the first fluid pipe 300 and the second valve 450 of the second fluid pipe 400 may be controlled. Through the turned-on/off of the first valve 350 and the second valve 450, a fluid having a high temperature or a low temperature may flow through the first part 300-1 of the first fluid pipe 300 and the second part 400-1 of the second fluid pipe 400 to control a temperature of the storage apparatus 100, and thus the storage apparatus 100 may be heated or cooled. Accordingly, the temperature of the storage apparatus 100 may be stably maintained within an operating temperature range regardless of an external temperature of a vehicle in which the storage apparatus 100 is installed.

Referring to FIG. 5B, a memory apparatus 1000b of the present embodiment may be different from the memory apparatus 1000 of FIG. 1 in the structure of a storage apparatus 100b. For example, in the memory apparatus 1000b of the present embodiment, the storage apparatus 100b may include the first memory device 120 which is mounted only on the upper surface of the package substrate 110. The first memory device 120 may be a non-volatile memory device such as a flash memory device, as described above. As the first memory device 120 and the second memory device 130 may be mounted on the upper surface of the package substrate 110 together with the controller 140, the structure of the storage apparatus 100b may be simplified, and accordingly, the manufacturing operation thereof may be simplified, and thus the reliability of the storage apparatus 100b and the memory apparatus 1000b may be improved, and mass productivity of the memory apparatus 1000b may be increased.

For reference, the upper surface of the package substrate 110 may mean an upward direction. The second fluid pipe 400 may be arranged on an upper surface of the case 200. The upper surface of the case 200 may be adjacent to the upper surface of the package substrate 110. As described above, a fluid having a low temperature may flow through the second fluid pipe 400, and accordingly, when the temperature of an upper surface portion of the package substrate 110 increases, the package substrate 110 may be efficiently cooled through the second part 400-1 of the second fluid pipe 400.

Similar to the memory apparatus 1000 of FIG. 1, the memory apparatus 1000b of the present embodiment may include the storage apparatus 100b in which a first TIM 160-1a and the second TIM 160-2 are installed. However, because the first memory device 120 is not arranged on the lower surface of the package substrate 110, the first TIM 160-1a may be arranged between the package substrate 110 and the case 200. Other components are not arranged on the lower surface of the package substrate 110, and the first TIM 160-1a may be arranged over (i.e., cover) the entire lower surface of the package substrate 110. The present invention is not limited thereto. For example, the first TIM 160-1a may cover the entire lower surface of the package substrate 110 except for end portions of the package substrate 110.

Referring to FIG. 5C, a memory apparatus 1000c of the present embodiment may be different from the memory apparatus 1000 of FIG. 1 in the structure of a storage apparatus 100c. For example, in the memory apparatus 1000c of the present embodiment, the storage apparatus 100c may further include a third TIM 160-3 between the second memory device 130 and the case 200, and a fourth TIM 160-4 between the controller 140 and the case 200. In the memory apparatus 1000c of the present embodiment, heat transfer between the second memory device 130 and the case 200 may be facilitated through the third TIM 160-3, and heat transfer between the controller 140 and the case may be facilitated through the fourth TIM 160-4.

Some examples have been shown for the arrangement positions of the TIM. However, the arrangement positions of the TIM are not limited to thereto. For example, in a memory apparatus of the present embodiment, TIMs may be arranged in various places in the storage apparatus to facilitate heat transfer to the storage apparatus. The temperature sensor 180 of the memory apparatus 1000a of FIG. 5A may be applied to memory apparatuses of various embodiments.

Figure 6:
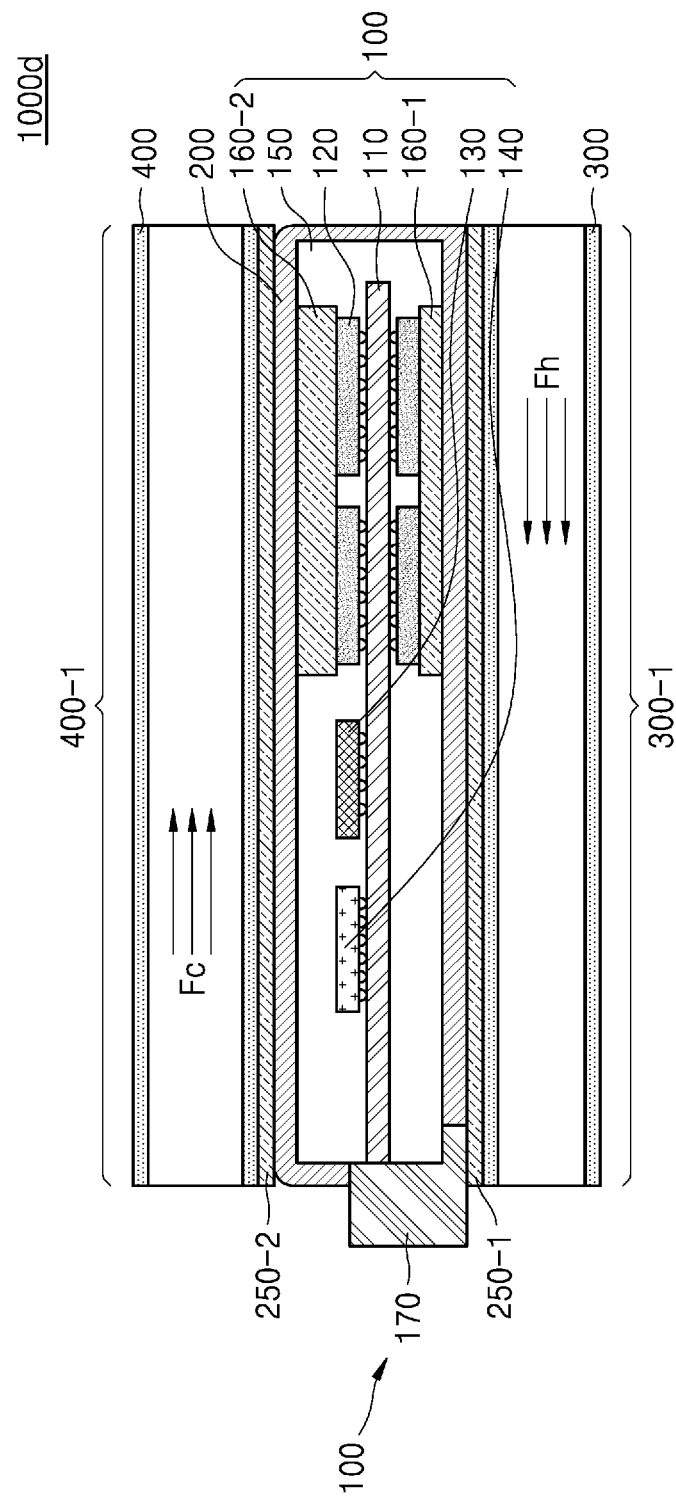
FIG. 6 is a cross-sectional view of a memory apparatus for a vehicle, according to an embodiment of the inventive concept.

FIG. 6 is a cross-sectional view of a memory apparatus 1000d, according to an embodiment of the inventive concept. Descriptions made with reference to FIGS. 1 to 5C will be briefly described or omitted.

Referring to FIG. 6, the memory apparatus 1000d of the present embodiment may be different from the memory apparatus 1000 of FIG. 1 by further including external TIMs 250-1 and 250-2. For example, the memory apparatus 1000d of the present embodiment may include the storage apparatus 100, the case 200, the first fluid pipe 300, the second fluid pipe 400, and the external TIMs 250-1 and 250-2. The storage apparatus 100, the case 200, the first fluid pipe 300, and the second fluid pipe 400 are as described with reference to FIGS. 1 and 2.

The external TIMs 250-1 and 250-2 may include a first external TIM 250-1 between the case 200 and the first fluid pipe 300, and a second external TIM 250-2 between the case 200 and the second fluid pipe 400. The external TIMs 250-1 and 250-2 may include substantially the same materials as the TIMs 160-1 and 160-2. However, the materials of the external TIMs 250-1 and 250-2 are not limited thereto. For example, the external TIMs 250-1 and 250-2 may include a material having a high thermal conductivity different from that of the TIMS 160-1 and 160-2. As described above, heat transfer between the first and second fluid pipes 300 and 400 and the storage apparatus 100 may be more smoothly performed by arranging the external TIMs 250-1 and 250-2. For example, heat transfer between the storage apparatus 100 and/or the case 200 and the first fluid pipe 300 may be smoothly performed through the first external TIM 250-1, and also, heat transfer between the storage apparatus 100 and/or the case 200 and the second fluid pipe 400 may be smoothly performed through the second external TIM 250-2.

Figure 7:
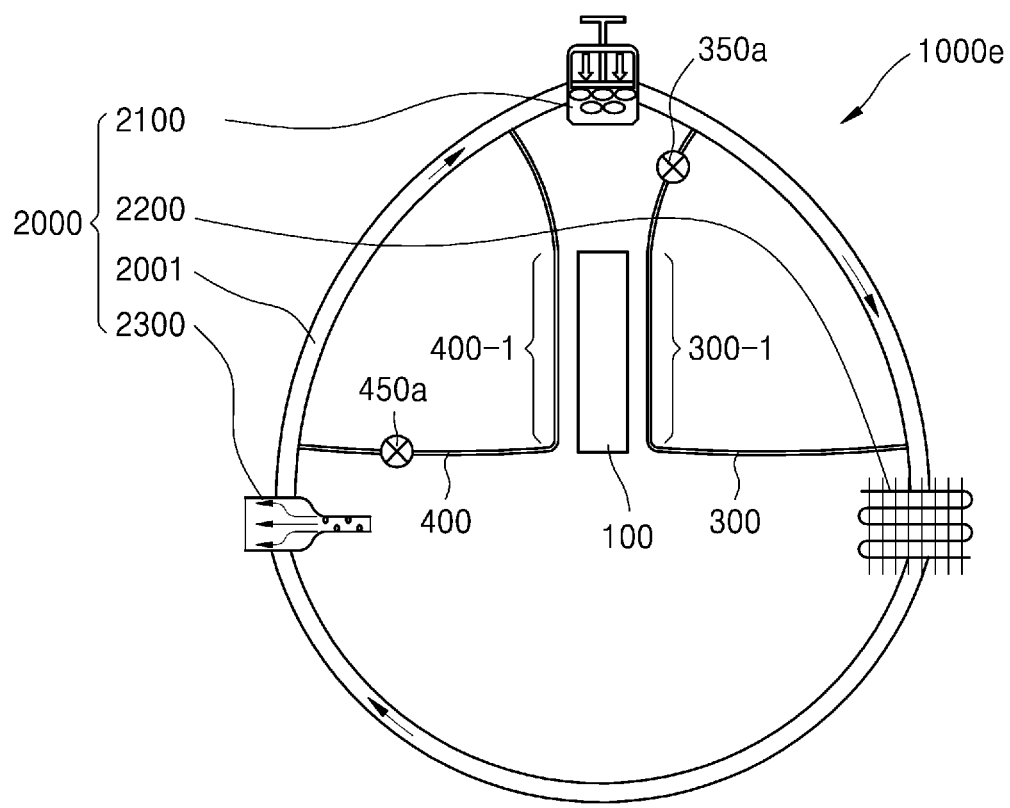
FIG. 7 is a conceptual diagram of a memory apparatus for a vehicle, according to an embodiment of the inventive concept.

FIG. 7 is a conceptual diagram of a memory apparatus 1000e, according to an embodiment of the inventive concept. Descriptions already made with reference to FIGS. 1 to 6 will be briefly described or omitted.

Referring to FIG. 7, the memory apparatus 1000e of the present embodiment may be different from the memory apparatus 1000 of FIG. 1 or 2 in the structure and function of first and second valves 350a and 450a. For example, in the memory apparatus 1000e of the present embodiment, the first fluid pipe 300 may include the first valve 350a, and the second fluid pipe 400 may include the second valve 450a. In the memory apparatus 1000e of the present embodiment, the first valve 350a and the second valve 450a may adjust a flow rate of a fluid together with the turned-on/off of the flow of the fluid. The flow rate is an amount of fluid flowing per hour, and may be expressed in ccm (cubic centimeter per minute), $m^3/s$, or the like.

The adjustment to the flow rate through first valve 350a and the second valve 450a may mean an adjustment to an amount of fluid flowing through the first fluid pipe 300 and the second fluid pipe 400, and also may mean an adjustment to an amount of fluid flowing through the first part 300-1 and the second part 400-1. The heating rate and the cooling rate of the storage apparatus 100 may be adjusted through the adjustment to the amount of fluid flowing through the first part 300-1 and the second part 400-1. For example, when the amount of fluid flowing through the first part 300-1 and the second part 400-1 is increased, the heating rate and the cooling rate of the storage apparatus 100 are increased, and when the amount of fluid flowing through the first part 300-1 and the second part 400-1 is decreased, the heating rate and the cooling rate of the storage apparatus 100 are decreased. Accordingly, when the temperature of the storage apparatus 100 is far out of a reference temperature range due to an unexpected reason, rapid heating or cooling may be performed by increasing the flow rate through the first valve 350a and the second valve 450a, and thus, the temperature of the storage apparatus 100 may be rapidly moved to an operating temperature range. An adjustment to the temperature of the storage apparatus 100 through the adjustment to a flow rate will be described in detail with reference to FIG. 8B.

Figure 8A:
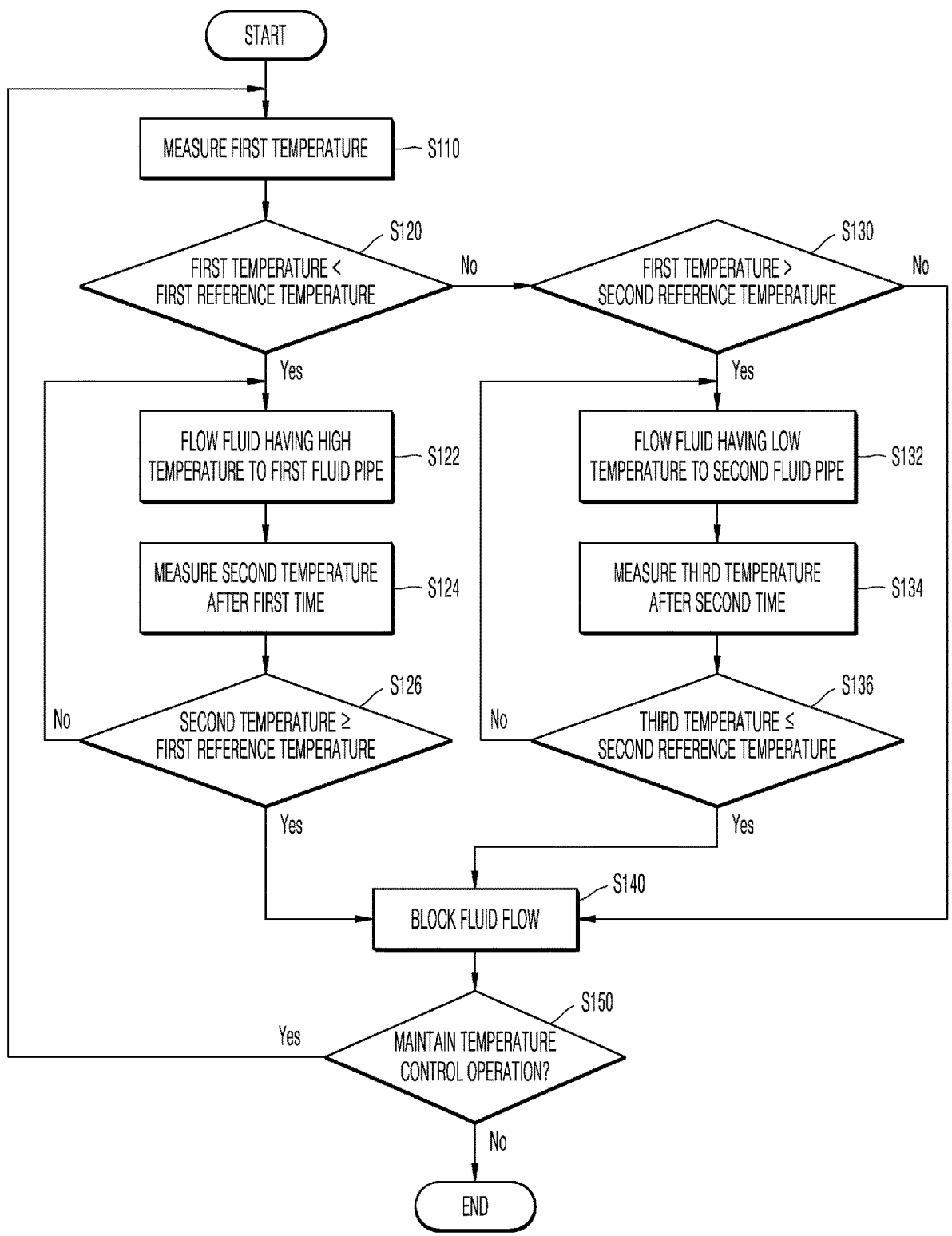
FIGS. 8A and 8B are flowcharts each illustrating a temperature control method of a memory apparatus for a vehicle, according to embodiments of the inventive concept.
Figure 8B:
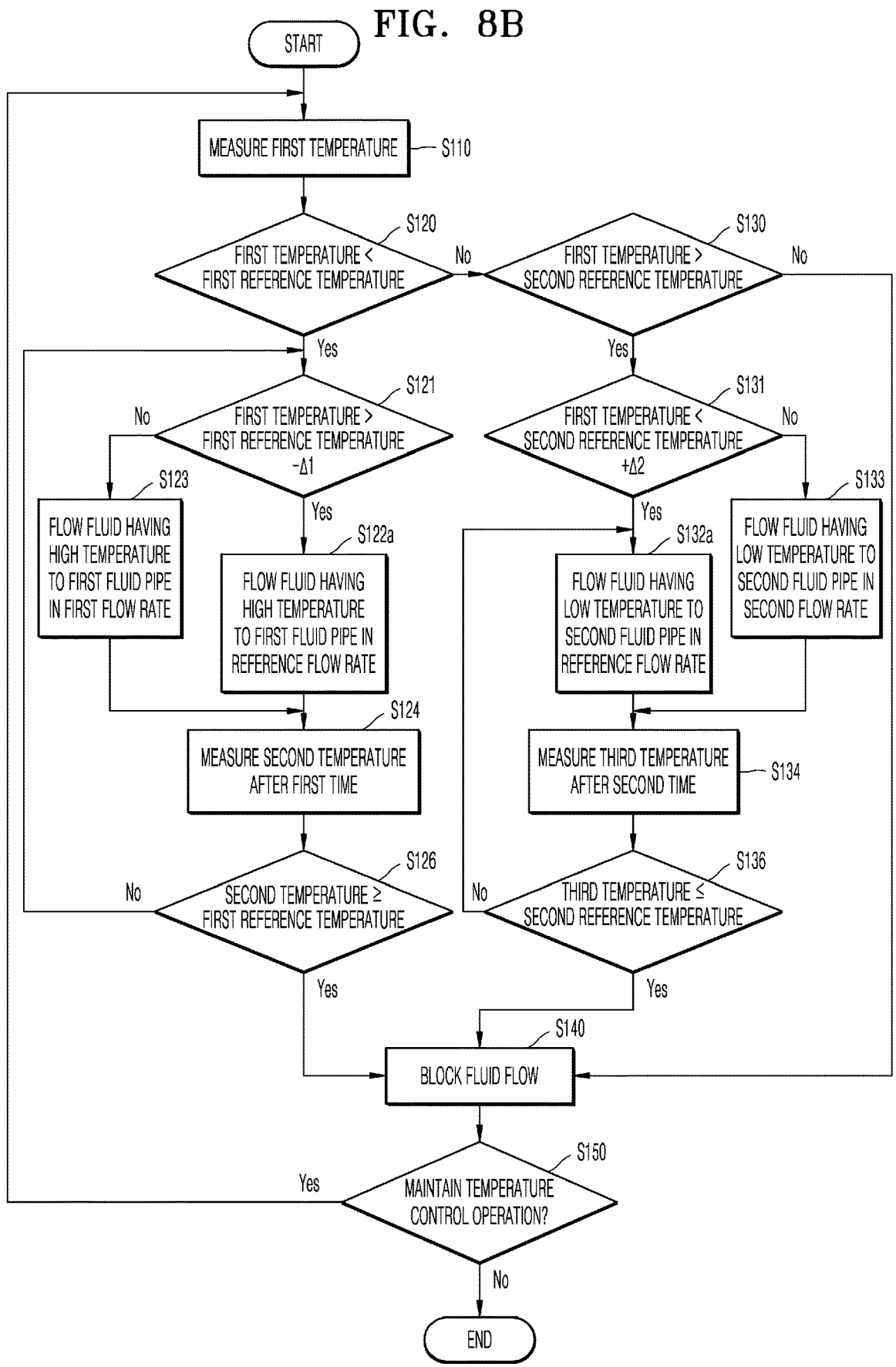

FIGS. 8A and 8B are flowcharts each schematically illustrating a temperature control method of a memory apparatus for a vehicle, according to embodiments of the inventive concept. Descriptions will be made with reference to FIGS. 1, 2, and 7 together, and those already described in FIGS. 1 to 7 will be briefly described or omitted.

Referring to FIG. 8A, in the temperature control method of the memory apparatus for a vehicle according to the present embodiment (hereinafter, simply referred to as a "temperature control method"), a first temperature of the storage apparatus 100 may be measured in operation S110. The measurement of the first temperature of the storage apparatus 100 may be, for example, performed by using a temperature sensor (180 of FIG. 5A) arranged in the storage apparatus 100.

Next, in operation S120, it is determined whether the measured first temperature is lower than a first reference temperature. Herein, the first reference temperature may be determined by the operating temperature range of the storage apparatus 100. For example, the operating temperature range of the storage apparatus 100 may be in the range of from about 0° C. to about 70° C., and in this operating temperature range, the first reference temperature may be, for example, 0° C. However, the operating temperature range of the storage apparatus 100 and the first reference temperature are not limited to the above values. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

When the first temperature is lower than the first reference temperature (Yes), a fluid having a high temperature is made to flow through the first fluid pipe 300 in operation S122. The flow of the fluid having a high temperature to the first fluid pipe 300 may be performed by the turned-on of the first valve 350 (i.e., by the opening of the first valve 350). According to the flow of the fluid having a high temperature to the first fluid pipe 300, the storage apparatus 100 may be heated through the first part 300-1 of the first fluid pipe 300.

Thereafter, after a first time, a second temperature of the storage apparatus 100 is measured in operation S124. Herein, the first time may be set by considering a rate at which the storage apparatus 100 is heated by the fluid having a high temperature.

Next, in operation S126, it is determined whether the measured second temperature is greater than or equal to the first reference temperature. When the second temperature is greater than or equal to the first reference temperature (Yes), the flow of the fluid is blocked in operation S140. Herein, the blocking of the flow of the fluid may mean blocking the flow of fluid having a high temperature to the first fluid pipe 300. The blocking of the flow of the fluid having a high temperature to the first fluid pipe 300 may be performed through the turned-off of the first valve 350 (i.e., by the closing of the first valve 350). As the flow of the fluid having a high temperature to the first fluid pipe 300 is blocked, heating of the storage apparatus 100 may be stopped. When the second temperature is still lower than the first reference temperature (No), operation S122 of making the fluid having a high temperature flow to the first fluid pipe 300 is performed, and thus the flow of the fluid having a high temperature to the first fluid pipe 300 is maintained and heating of the storage apparatus 100 is continuously performed.

When the first temperature is greater than or equal to the first reference temperature (No) in operation S120 of determining whether the first temperature is lower than the first reference temperature, it is determined whether the first temperature is greater than a second reference temperature in operation S130. The second reference temperature may be determined by the operating temperature range of the storage apparatus 100. For example, the operating temperature range of the storage apparatus 100 may be about 0° C. to about 70° C., and the second reference temperature may be, for example, 70° C. However, the operating temperature range of the storage apparatus 100 and the second reference temperature are not limited to the above values.

When the first temperature is greater than the second reference temperature (Yes), a fluid having a low temperature is made to flow through the second fluid pipe 400 in operation S132. The flow of the fluid having a low temperature to the second fluid pipe 400 may be performed by the turned-on of the second valve 450 (i.e., by the opening of the second valve 450). According to the flow of the fluid having a low temperature to the second fluid pipe 400, the storage apparatus 100 may be cooled through the second part 400-1 of the second fluid pipe 400.

Thereafter, after a second time, a third temperature of the storage apparatus 100 is measured in operation S134. Herein, the second time may be set by considering a rate at which the storage apparatus 100 is cooled by the fluid having a low temperature.

Next, in operation S136, it is determined whether the measured third temperature is less than or equal to the second reference temperature. When the third temperature is less than or equal to the second reference temperature (Yes), the flow of the fluid is blocked in operation S140. Herein, the blocking of the flow of the fluid may mean blocking the flow of fluid having a low temperature to the second fluid pipe 400. The blocking of the flow of the fluid having a low temperature to the second fluid pipe 400 may be performed through the turned-off of the second valve 450 (i.e., by the closing of the second valve 450). As the flow of the fluid having a low temperature to the second fluid pipe 400 is blocked, cooling of the storage apparatus 100 may be stopped. When the third temperature is still greater than the second reference temperature (No), operation S132 of making the fluid having a low temperature flow to the second fluid pipe 400 is performed, and thus the flow of the fluid having a low temperature to the second fluid pipe 400 is maintained and cooling of the storage apparatus 100 is continuously performed.

When the first temperature is determined to be less than or equal to the second reference temperature (No) in operation S130 of determining whether the first temperature is greater than second reference temperature, operation S140 of blocking the flow of the fluid is performed. After operation S140 of blocking the flow of the fluid, it is determined whether to maintain a temperature control operation in operation S150. When the temperature control method is maintained (Yes), operation S110 of measuring the first temperature is performed, and when the temperature control method is not maintained (No), the temperature control method is terminated.

In the temperature control method of the present embodiment, the memory apparatus 1000 of FIG. 1, according to the temperature of the storage apparatus 100, may heat or cool the storage apparatus 100 by using the first fluid pipe 300 and the second fluid pipe 400 connected to the air conditioning apparatus 2000, and thus the temperature of the storage apparatus 100 may be stably maintained within the operating temperature range regardless of an external temperature of a vehicle in which the storage apparatus 100 is installed, such as a temperature in summer or winter. As a result, using the temperature control method of the present embodiment, the temperature of the storage apparatus 100 may be reliably controlled regardless of an external temperature of a vehicle.

Referring to FIG. 8B, the temperature control method of the present embodiment may be different from the temperature control method of FIG. 8A in that heating and cooling of the storage apparatus 100 are further subdivided and performed by adjusting a flow rate of a fluid. For example, in the temperature control method of the present embodiment, after operation S110 of measuring the first temperature and operation S120 of determining whether the first temperature is less than the first reference temperature, when the first temperature is less than the first reference temperature (Yes), it is determined whether the first temperature is greater than a value of "first reference temperature—Δ1" in operation S121. Herein, a value of Δ1 may be a criterion for determining whether the first temperature is excessively deviated from the first reference temperature. The value of Δ1 may be determined according to the operating temperature range of the storage apparatus 100 and the performance of the storage apparatus 100. For example, when the storage apparatus 100 has excellent performance (e.g., operates at a high speed) and operates at a relatively low temperature, the value of Δ1 may increase.

When the first temperature is greater than the value of "the first reference temperature—Δ1" (Yes), a fluid having high temperature is made to flow through the first fluid pipe 300 in a reference flow rate in operation S122a. For example, when the first temperature does not deviate much from the first reference temperature, the first fluid pipe 300 may be turned on to be open through the first valve 350a, and the first fluid pipe 300 may be open to an appropriate size only to an extent that a reference flow rate flows. Thereafter, after the first time, the second temperature is measured in operation S124.

When the first temperature is equal to or less than the value of "the first reference temperature—Δ1" (No), a fluid having a high temperature is made to flow through the first fluid pipe 300 in a first flow rate in operation S123. Herein, the first flow rate may be greater than the reference flow rate, and may be determined according to the heating rate of the storage apparatus 100 according to the flow rate of the fluid having a high temperature. For example, when the first temperature deviates much from the first reference temperature, the first fluid pipe 300 may be turned on to be open through the first valve 350a, and the first fluid pipe 300 may be largely open to allow a flow rate corresponding to the first flow rate to flow. As a large amount of fluid having a high temperature corresponding to the first flow rate flows through the first fluid pipe 300, the storage apparatus 100 may be rapidly heated through the first part 300-1. Thereafter, after the first time, the second temperature is measured in operation S124.

When the first temperature is greater than the second reference temperature (Yes) in operation S130 of determining whether the first temperature is greater than the second reference temperature, it is determined whether the first temperature is less than a value of "the second reference temperature+Δ2" in operation S131. Herein, a value of Δ2 may be a criterion for determining whether the first temperature is excessively deviated from the second reference temperature. The value of Δ2 may be determined according to the operating temperature range of the storage apparatus 100 and the performance of the storage apparatus 100. For example, when the storage apparatus 100 has excellent performance (i.e., operates at a high speed) and operates at a relatively high temperature, the value of Δ2 may increase.

When the first temperature is less than the value of "the first reference temperature+Δ2" (Yes), a fluid having a low temperature is made to flow through the second fluid pipe 400 at the reference flow rate in operation S132a. For example, when the first temperature does not deviate much from the second reference temperature, the second fluid pipe 400 may be turned on to be open through the second valve 450a, and the second fluid pipe 400 may be open to an appropriate size only to an extent that the reference flow rate flows. Thereafter, after the second time, the third temperature is measured in operation S134.

When the second temperature is equal to or greater than the value of "the second reference temperature+Δ2" (No), the fluid having a low temperature is made to flow through the second fluid pipe 400 in a second flow rate in operation S133. Herein, the second flow rate may be greater than the reference flow rate, and may be determined according to the cooling rate of the storage apparatus 100 according to the flow rate of the fluid having a low temperature. For example, when the first temperature deviates much from the second reference temperature, the second fluid pipe 400 may be turned on to be open through the second valve 450a, and the second fluid pipe 400 may be largely open to allow a flow rate corresponding to the second flow rate to flow. As a large amount of fluid having a low temperature corresponding to the second flow rate flows through the second fluid pipe 400, the storage apparatus 100 may be rapidly cooled through the second part 400-1. Thereafter, after the second time, the third temperature is measured in operation S134.

In the temperature control method of FIG. 8B, a degree of deviation from the first reference temperature is determined based on Δ1 and a degree of deviation from the second reference temperature is determined based on Δ2, and accordingly, a flow rate may be adjusted through the first and second valves 350a and 450a, but the temperature control method according to the present embodiment is not limited thereto. In some embodiments, a flow rate may be more precisely adjusted through the first and second valves 350a and 450a.

While the inventive concept has been particularly shown and described with reference to embodiments thereof, it will be understood that various changes in form and details may be made therein without departing from the spirit and scope of the following claims.

What is claimed is:

1. A memory apparatus for a vehicle, the memory apparatus comprising:
   a storage apparatus comprising at least one semiconductor memory device;
   a first fluid pipe having a first part that extends along a first outer surface of the storage apparatus and heats the storage apparatus; and
   a second fluid pipe having a second part that extends along a second outer surface of the storage apparatus and cools the storage apparatus, the second outer surface being opposite to the first outer surface, wherein a first fluid having a high temperature greater than or equal to a reference temperature flows through the first fluid pipe, and
wherein a second fluid having a low temperature less than the reference temperature flows through the second fluid pipe.

2. The memory apparatus of claim 1, further comprising:
a first valve configured to control a flow of the first fluid in the first fluid pipe; and
a second valve configured to control a flow of the second fluid in the second fluid pipe.

3. The memory apparatus of claim 2,
wherein the storage apparatus further includes a temperature sensor, and
wherein each of the first valve and the second valve is open or closed according to a temperature of the storage apparatus measured by the temperature sensor to control the temperature of the storage apparatus.

4. The memory apparatus of claim 2,
wherein a cooling or heating rate of the storage apparatus is controlled by adjusting at least one of a flowing amount of the first fluid by the first valve and a flowing amount of the second fluid by the second valve.

5. The memory apparatus of claim 1,
wherein each of the first fluid pipe and the second fluid pipe is connected to a main fluid pipe of an air conditioning apparatus for the vehicle.

6. The memory apparatus of claim 5,
wherein a first portion of the main fluid pipe connects an output of a compressor of the vehicle to an input of a condenser of the vehicle,
wherein a second portion of the main fluid pipe connects an input of the compressor of the vehicle to an output of an evaporator of the vehicle,
wherein the first fluid pipe has a first end coupled to a first point of the first portion of the main fluid pipe and a second end coupled to a second point of the first portion of the main fluid pipe, the first point of the first portion being closer to the output of the compressor than the input of the condenser, and the second point of the first portion being closer to the input of the condenser than the output of the compressor, and
wherein the second fluid pipe has a third end coupled to a third point of the second portion of the main fluid pipe and a fourth end coupled to a fourth point of the second portion of the main fluid pipe, the third point of the second portion being closer to the input of the compressor than the output of the evaporator, and the fourth point of the second portion being closer to the output of the evaporator than the input of the compressor.

7. The memory apparatus of claim 1, further comprising:
a case enclosing the storage apparatus,
wherein the second part includes a planar portion contacting an outer surface of the case.

8. The memory apparatus of claim 1,
wherein each of the first part and the second part has a plurality of flow passages each of which has a cross-sectional shape of a hexagon.

9. The memory apparatus of claim 1, further comprising:
a first thermal interface material (TIM) between the first part and the first outer surface of the storage apparatus; and
a second TIM between the second part and the second outer surface of the storage apparatus.

10. The memory apparatus of claim 1, further comprising:
a case accommodating the storage apparatus,
wherein the storage apparatus further comprises a package substrate and a thermal interface material (TIM),
wherein the at least one semiconductor memory device comprises a plurality of memory devices mounted on at least one of an upper surface of the package substrate and a lower surface of the package substrate, and
wherein the TIM is between an inner surface of the case and the plurality of memory devices mounted on at least one of the upper surface of the package substrate and the lower surface of the package substrate.

11. The memory apparatus of claim 1, further comprising a case accommodating the storage apparatus,
wherein the storage apparatus is a solid state drive (SSD) package,
wherein the at least one semiconductor memory device comprises a plurality of flash memory devices,
wherein the storage apparatus further comprises a package substrate, and a dynamic random access memory (DRAM) device, a controller mounted on the package substrate, and a thermal interface material (TIM),
wherein the plurality of flash memory devices are mounted on at least one of an upper surface of the package substrate and a lower surface of the package substrate, and
wherein the TIM is between an inner surface of the case and the plurality of flash memory devices mounted on the at least one of the upper surface of the package substrate and the lower surface of the package substrate.

12. A memory apparatus for a vehicle, the memory apparatus comprising:
a storage apparatus comprising at least one memory device and a temperature sensor;
a first fluid pipe having a first part that extends along a first outer surface of the storage apparatus, wherein a flow of a first fluid having a high temperature greater than or equal to a reference temperature is controlled by a first valve at the first fluid pipe; and
a second fluid pipe having a second part that extends along a second outer surface of the storage apparatus, the second outer surface being opposite to the first outer surface, wherein a flow of a second fluid having a low temperature less than the reference temperature is controlled by a second valve at the second fluid pipe,
wherein opening and closing of each of the first valve and the second valve are controlled according to a temperature of the storage apparatus measured by the temperature sensor to adjust the temperature of the storage apparatus.

13. The memory apparatus of claim 12,
wherein when the temperature measured by the temperature sensor is less than a first reference temperature, the first valve is controlled to be open so that the first fluid flows through the first fluid pipe, and the second valve is controlled to be closed so that the flow of the second fluid is blocked at the second fluid pipe,
wherein when the temperature measured by the temperature sensor is greater than a second reference temperature which is greater than the first reference temperature, the first valve is controlled to be closed so that the flow of the first fluid is blocked at the first fluid pipe, and the second valve is controlled to be open so that the second fluid flows through the second fluid pipe, and
wherein when the temperature measured by the temperature sensor is greater than or equal to the first reference temperature and is less than or equal to the second reference temperature, the first valve and the second valve are controlled to be closed so that the flow of the first fluid and the flow of the second fluid are blocked at the first fluid pipe and the second fluid pipe, respectively.

14. The memory apparatus of claim 12,
wherein the first fluid pipe and the second fluid pipe are connected to a main fluid pipe of an air conditioning apparatus for the vehicle,
wherein a first portion of the main fluid pipe connects an output of a compressor of the air conditioning apparatus to an input of a condenser of the air conditioning apparatus,
wherein a second portion of the main fluid pipe connects an input of the compressor of the air conditioning apparatus to an output of an evaporator of the air conditioning apparatus,
wherein the first fluid pipe has a first end coupled to a first point of the first portion of the main fluid pipe and a second end coupled to a second point of the first portion of the main fluid pipe, the first point of the first portion being closer to the output of the compressor than the input of the condenser, and the second point of the first portion being closer to the input of the condenser than the output of the compressor, and
wherein the second fluid pipe has a third end coupled to a third point of the second portion of the main fluid pipe and a fourth end coupled to a fourth point of the second portion of the main fluid pipe, the third point of the second portion being closer to the input of the compressor than the output of the evaporator, and the fourth point of the second portion being closer to the output of the evaporator than the input of the compressor.

15. The memory apparatus of claim 12, further comprising:
a first thermal interface material (TIM) between the first part and the first outer surface of the storage apparatus; and
a second TIM between the second part and the second outer surface of the storage apparatus.

16. The memory apparatus of claim 12, further comprising:
a case accommodating the storage apparatus,
wherein the storage apparatus further comprises a package substrate and a thermal interface material (TIM),
wherein the at least one memory device comprises a plurality of memory devices mounted on at least one of an upper surface of the package substrate and a lower surface of the package substrate, and
wherein the TIM is between an inner surface of the case and the plurality of memory devices mounted on at least one of the upper surface of the package substrate and the lower surface of the package substrate.

17. A memory apparatus for a vehicle, the memory apparatus comprising:
a storage apparatus comprising a package substrate, a plurality of flash memory devices, a dynamic random access memory (DRAM) device, a controller, and a temperature sensor;
a case having a rectangular parallelepiped shape and accommodating the storage apparatus;
a first fluid pipe having a first part that extends along a first outer surface of the case, wherein a flow of a first fluid having a high temperature greater than or equal to a reference temperature is controlled by a first valve at the first fluid pipe; and
a second fluid pipe having a second part that extends along a second outer surface of the case, the second outer surface of the case being opposite to the first outer surface of the case, wherein a flow of a second fluid having a low temperature less than the reference temperature is controlled by a second valve at the second fluid pipe,
wherein opening and closing of each of the first valve and the second valve are controlled according to a temperature of the storage apparatus measured by the temperature sensor to adjust the temperature of the storage apparatus.

18. The memory apparatus of claim 17,
wherein the first fluid pipe and the second fluid pipe are connected to a main fluid pipe of an air conditioning apparatus for the vehicle,
wherein a first portion of the main fluid pipe connects an output of a compressor of the air conditioning apparatus to an input of a condenser of the air conditioning apparatus,
wherein a second portion of the main fluid pipe connects an input of the compressor of the air conditioning apparatus to an output of an evaporator of the air conditioning apparatus,
wherein the first fluid pipe has a first end coupled to a first point of the first portion of the main fluid pipe and a second end coupled to a second point of the first portion of the main fluid pipe, the first point of the first portion being closer to the output of the compressor than the input of the condenser, and the second point of the first portion being closer to the input of the condenser than the output of the compressor, and
wherein the second fluid pipe has a third end coupled to a third point of the second portion of the main fluid pipe and a fourth end coupled to a fourth point of the second portion of the main fluid pipe, the third point of the second portion being closer to the input of the compressor than the output of the evaporator, and the fourth point of the second portion being closer to the output of the evaporator than the input of the compressor.

19. The memory apparatus of claim 17, further comprising:
a first thermal interface material (TIM) between the first part and the first outer surface of the case; and
a second TIM between the second part and the second outer surface of the case.

20. The memory apparatus of claim 17,
wherein the plurality of flash memory devices are mounted on at least one of an upper surface of the package substrate and a lower surface of the package substrate, and
wherein the storage apparatus further includes:
a thermal interface material (TIM) between an inner surface of the case and the plurality of flash memory devices mounted on at least one of the upper surface of the package substrate and the lower surface of the package substrate.

* * * * *